United States Patent [19]

Williamson

[11] 4,240,076
[45] Dec. 16, 1980

[54] STARTING CIRCUIT FOR AUTOMATIC FREQUENCY CONTROL ARRANGEMENT

[75] Inventor: James Williamson, Franklin, Mass.

[73] Assignee: Raytheon Company, Lexington, Mass.

[21] Appl. No.: 912,600

[22] Filed: Jun. 5, 1978

[51] Int. Cl.³ .................... G01S 13/00; H03B 3/04
[52] U.S. Cl. ........................ 343/7 PL; 331/4
[58] Field of Search ................ 331/4, 10, 11, 14, 17, 331/18, 25, 30; 343/5 AF, 7 PL

[56] References Cited

U.S. PATENT DOCUMENTS

| | | | |
|---|---|---|---|
| 3,569,965 | 3/1971 | Bagley | 343/5 AF |
| 3,611,175 | 10/1971 | Boelke | 331/4 |
| 3,913,029 | 10/1975 | Caspari et al. | 331/4 |
| 4,072,947 | 2/1978 | Johnson | 343/7 PL |
| 4,137,508 | 1/1979 | Nugenholtz | 331/4 |

Primary Examiner—Nelson Moskowitz
Attorney, Agent, or Firm—Philip J. McFarland; Joseph D. Pannone

[57] ABSTRACT

An improved automatic frequency control arrangement for a missile-borne inverse receiver is shown to include a reference oscillator and a voltage-controlled oscillator with control means for the latter, such means including a frequency-to-voltage converter responsive to the difference frequency between the two oscillators so that the latter may produce a signal representative of the Doppler shift frequency of a target. A starting circuit is also shown to ensure that the frequency of the reference oscillator is always lower than the frequency of the voltage-controlled oscillator.

1 Claim, 2 Drawing Figures

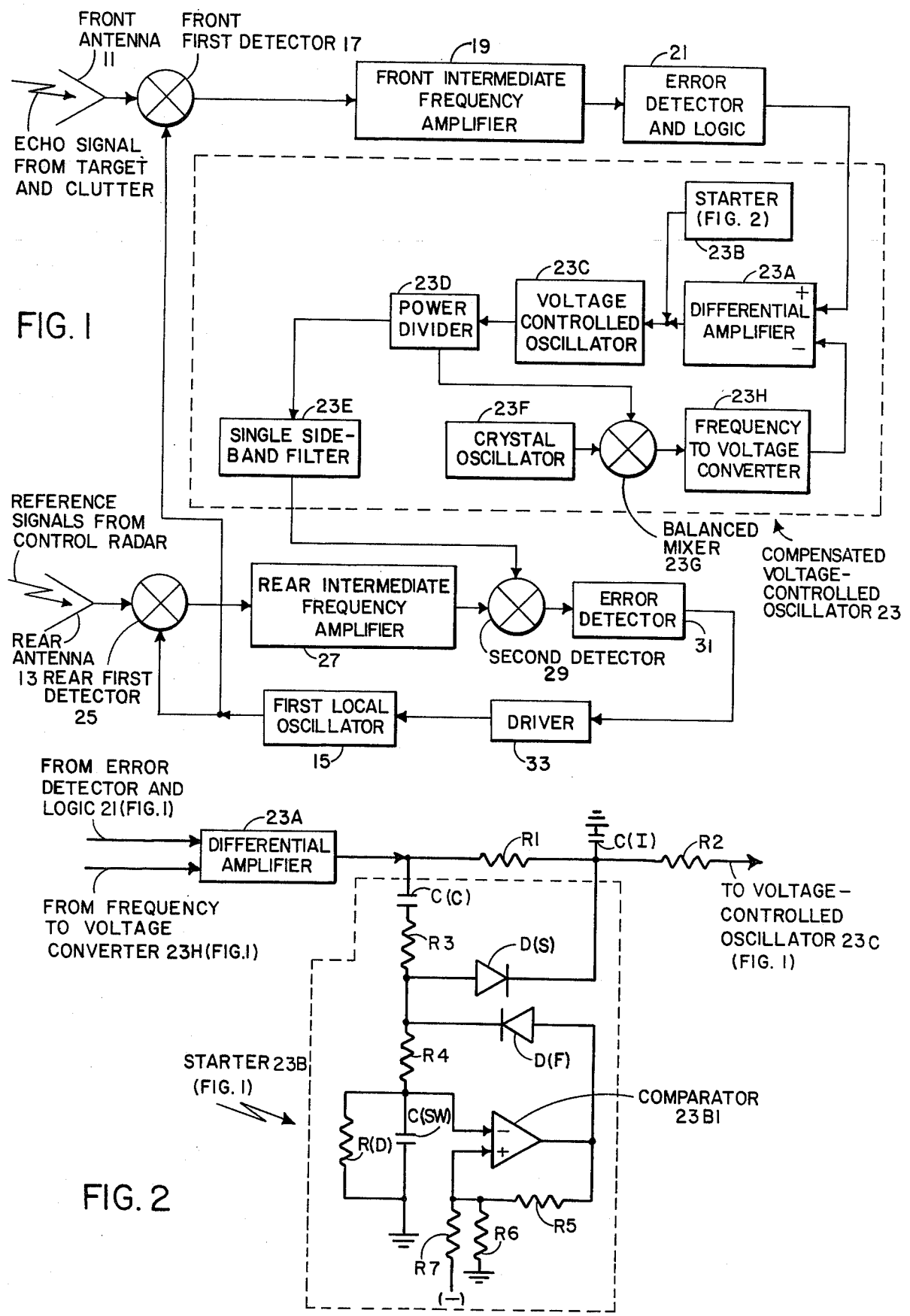

STARTING CIRCUIT FOR AUTOMATIC FREQUENCY CONTROL ARRANGEMENT

The invention herein described was made in the course of, or under a contract or subcontract thereunder, with the Department of Defense.

BACKGROUND OF THE INVENTION

This invention pertains generally to radar guidance systems for guided missiles and particularly to the missile-borne receivers in radar guidance systems incorporating semiactive guidance techniques.

It is common practice in the art to provide, in a semiactive guidance system, a missile-borne radar receiver which is adapted to distinguish between radar echo signals from a target to be tracked (hereinafter referred to simply as the target) and echo signals from other illuminated objects, such as clutter, by reason of the difference in the Doppler shifts of any echo signals received. To accomplish such purpose it is necessary that the frequency of the first local oscillator in the missile-borne radar receiver be coherent with the frequency of the illuminating signal transmitted from a control radar.

In the present state of development of local oscillators it is more feasible to provide an adjusting arrangement in a missile-borne receiver than to provide a local oscillator having the requisite stability to maintain coherence with an illuminating signal from a control radar. Therefore, it is common practice in the art to provide a so-called rear receiver in a missile-borne radar receiver operating to maintain coherence between the frequency of the first local oscillator and the frequency of the illuminating signals from the control radar.

It is also common practice to use a so-called inverse receiver in combination with a rear receiver to improve the degree with which echo signals from a target and from other illuminated objects may be distinguished. Briefly, such a receiver is a heterodyne receiver with an intermediate frequency amplifier having an extremely narrow bandwidth, means for precisely setting the frequency of a first local oscillator in accordance with the Doppler shift of echo signals from a target and correction means responsive to any change in frequency of the signals out of the intermediate frequency amplifier to adjust the frequency of the first local oscillator to null any such change.

It has in the past been known to use a voltage controlled crystal oscillator, or VXCO, in the correction means mentioned above. However, because the output frequency of any VXCO used in such an application must be linearly variable over a range corresponding to the range of possible Doppler shifts to be encountered and because the output frequency of any such VXCO must be substantially unaffected by changes in ambient temperature, it is almost impossible to provide satisfactory correction means. That is to say, with presently known elements, satisfactory correction means for adjusting the frequency of the first local oscillator in known inverse receivers are very difficult and expensive to implement.

SUMMARY OF THE INVENTION

With the foregoing in mind, it is a primary object of this invention to provide, in a missile-borne radar receiver, improved means for correcting the frequency of a first local oscillator in accordance with the Doppler shift of echo signals from targets.

Another object of this invention is to provide improved correction means as above wherein the elements used are conventional in nature and may be made to be almost independent of changes in ambient temperature or other ordinarily error-producing effects.

Still another object of this invention is to provide improved correction means as above wherein a voltage-controlled oscillator is forced, regardless of operational conditions, to produce an output signal having the proper frequency to ensure the proper operation of the correction means.

The foregoing and other objects of this invention are generally attained by providing, in a frequency control circuit for the first local oscillator of a missile-borne radar receiver, a voltage-controlled oscillator whose frequency is automatically controlled in accordance with the Doppler shift of echo signals from a target. In the preferred embodiment of the invention, before echo signals from a target are received the automatic frequency control arrangement for the voltage-controlled oscillator is operative to force the output signal of the voltage-controlled oscillator to a frequency that is properly related to the frequency of a reference oscillator.

BRIEF DESCRIPTION OF THE DRAWINGS

For a more complete understanding of this invention, reference is now made to the following description of the accompanying drawings wherein:

FIG. 1 is a block diagram, greatly simplified for expository reasons, of a missile-borne receiver illustrating how a preferred embodiment of this invention may be incorporated in such a receiver; and FIG. 2 is a simplified schematic drawing of the means for setting the output of the voltage-controlled oscillator.

DESCRIPTION OF THE PREFERRED EMBODIMENTS

Before referring to FIG. 1 in detail it will be repeated that the arrangement there illustrated is a greatly simplified representation of a missile-borne radar receiver with only the minimum number of elements being shown to allow the positioning of the contemplated voltage-controlled oscillator in an exemplary case. Thus, a missile-borne receiver for use in a semiactive guidance system is shown to comprise: (a) a front antenna 11 for receiving echo signals from a target and clutter (not shown) illuminated by signals transmitted from a control radar (not shown); (b) a rear antenna 13 for receiving reference signals from such radar; and (c) means responsive to the received echo signals for automatically tuning the receiver to the echo signals from the target.

The general arrangement of the automatic tuning means is such that that means operates as a so-called inverse receiver. In such a receiver, the frequency of a first local oscillator 15 (here a voltage-controlled oscillator) is maintained at a frequency offset by a predetermined amount from the frequency of the echo signals from the target so that, after heterodyning in a front first detector 17 (here a balanced mixer) only downshifted echo signals from the target fall within the pass band of a front intermediate frequency amplifier 19. The latter then produces an amplified replica of only the echo signals from the target. To put it another way, the front intermediate amplifier 19 rejects all undesirable signals so that a conventional error detector and logic arrangement 21 is caused to produce a correction signal (sometimes referred to hereinafter simply as "$V_c$") based only on the difference between the frequencies of the downshifted echo signals from the target and the center frequency of the front intermediate frequency amplifier 19. $V_c$ is applied to a compensated voltage-controlled oscillator 23. That assembly, connected as shown, comprises a differential amplifier 23A, a starter 23B (to be described in detail in connection with FIG. 2), a voltage controlled oscillator 23C, a power divider 23D, a single sideband filter 23E, a crystal oscillator 23F, a balanced mixer 23G and a frequency-to-voltage converter 23H. The latter element here is a type VFC32 converter manufactured by Burr-Brown, International Airport Industrial Park, Tucson, Arizona 85734.

It will now be appreciated by one of skill in the art that the balanced mixer 23G is effective to suppress the image generated when the outputs of the crystal oscillator 23F and the voltage controlled oscillator are mixed. Unfortunately, however, the frequency-to-voltage converter 23H produces the same output signal whether the frequency of the crystal oscillator 23F is greater or less than the frequency of the voltage-controlled oscillator 23C. This means in turn that, unless provision is made to ensure keeping the frequency of either one of the oscillators always higher than the other, the sense of the output signal of the frequency-to-voltage converter 23H may be incorrect, rendering the arrangement inoperable.

The starter 23B, as shown in detail in FIG. 2, obviates the foregoing by making it certain that the frequency of the voltage-controlled oscillator 23C is always higher than the frequency of the crystal oscillator 23F so that the sense of the output of the frequency-to-voltage converter 23H is always correct.

The starter 23B comprises a comparator 23B1 having its positive input terminal connected to a negative source (not shown but here $-15$ volts) through a voltage divider made up of resistors R7 and R6. The resistances of resistors R7 and R6 here are, respectively, 100 kilohms and 12 kilohms. The negative input terminal of the comparator 23B1 is connected to ground through a resistor R(D) having a resistance of 50 kilohms and a capacitor C(SW) having a capacitance of 2 microfarads. The negative input terminal of the comparator 23B1 is also connected through a resistor R4, a diode D(S) and a resistor R1 to the output terminal of the differential amplifier 23A. The resistors R4 and R1 have, respectively, resistances of 2 kilohms and 100 kilohms. With the differential amplifier saturated, i.e. with the level of the output of the frequency-to-voltage converter higher, by some 5 volts, than $V_c$, the level of the voltage at the output terminal of the differential amplifier is approximately $-15$ volts. It should be noted that the level of the voltage ($-15$ volts) at the output terminal of the differential amplifier is initially the same whether the frequency of the voltage-controlled oscillator 23C (FIG. 1) is higher or lower than the frequency of the crystal oscillator 23F (FIG. 1). Capacitor C(SW) then may charge negatively until the level of the voltage on negative input terminal of the comparator 23B1 goes below the level of the voltage on the positive input terminal of that element. The level of the output of the comparator 23B1 then rises abruptly to $+15$ volts. With feedback through a resistor R5 having a resistance of 3 kilohms, the level at the positive input terminal of the comparator 23B1 rises abruptly to approximately 12 volts. A diode D(F) connected between the output terminal of the comparator 23B1 and the junction between resistor R4 and diode D(S), is then biased to its conductive state. The junction between the resistors R1, R2 is, therefore, forced to a level of $+15$ volts, less the voltage drops in the diodes D(F) and D(S). As a result, the frequency of the voltage-controlled oscillator 23(C) (FIG. 1) is unconditionally forced to a value higher than the frequency of the crystal oscillator 23F, even though the level of the voltage at the output of the differential amplifier 23A remains still at $-15$ volts. Conduction through the diode D(F) also completes a path through the resistor R4 for charging the capacitor C(SW) positively toward the level of $+15$ volts. However, when the voltage across the capacitor C(SW) exceeds the level of the voltage on the positive terminal of the comparator 23B1, that element returns to its nonconducting state, causing in turn diode D(F) to be rendered nonconducting and stopping further charging of the capacitor C(SW). The level of the voltage at the junction of the resistors R1, R2 then drops to follow the level of the voltage across the capacitor C(SW). That element, however, immediately starts to discharge (mainly through resistor R(D) but also through the paths defined by resistor R4, diode D(S), resistor R2 and input impedance (not shown) of the voltage controlled oscillator 23C (FIG. 1) as well as resistor R1 and the output impedance of the differential amplifier (23A). As the capacitor C(SW) discharges, the control voltage on the voltage controlled oscillator 23C (FIG. 1) decreases, the frequency of the output of that element decreases, approaching the frequency of the crystal oscillator 23F (FIG. 1). The voltage out of the frequency-to-voltage converter 23H also decreases, approaching $V_c$. The output of the differential amplifier ultimately then moves from $-15$ volts in a positive direction causing a current flow through capacitor C(C) and resistor R3 opposite in direction to the current from the capacitor C(SW). In effect, then, the time constant of the discharge path of the capacitor C(SW) is momentarily increased, slowing the rate of change of the control voltage on the voltage controlled oscillator 23C (FIG. 1) allowing more time for an AFC capture to be made. At that time, then, the frequency of the voltage-controlled oscillator 23C (FIG. 1) is above the frequency of the crystal oscillator 23F (FIG. 1) by, say, 20 KHz to 200 KHz, and the differential amplifier 23A is operating in the linear portion of its characteristic curve. As diode D(S) is still conductive, AC signals to the voltage-controlled oscillator 23C (FIG. 1) pass through capacitor C(C), resistor R3, diode D(S) and resistor R2. Signals through that path change the integration time of an integrating capacitor C(I) to increase the loop gain, thereby enhancing capture capability. Under such conditions then $V_c$ (which is indicative of a specific frequency between 20 KHz and 200 KHz) is effective to drive the frequency of the voltage-controlled oscillator 23C to the specific frequency indicative of the Doppler shift of a target being tracked and to control the frequency of the voltage-controlled oscillator in accordance with such Doppler shift even though changes may occur. Ultimately, as capacitor C(SW) continues to discharge, diode D(S) becomes back-biased, removing the shunt (capacitor C(C), resistor R3 and diode D(S)) from across resistor R1 and all of the elements of the just described arrangement of the starter 23B return to their initial states and control of the voltage-controlled oscillator 23C is returned solely to the signal out of the differential amplifier 23A. If, for any reason, lock is lost the described operational cycle will be automatically repeated to regain tracking as soon as possible.

It will be observed that, to accomplish the just-mentioned offset between the frequencies of the echo signals from the target and the first local oscillator 15, it is also necessary here to utilize the reference signals from the control radar (not shown). To accomplish that end, the reference signals are downshifted in a rear first detector 25 (here a balanced mixer) and are then passed through a rear intermediate frequency amplifier 27 to a second detector 29 (here a balanced mixer). The output of the latter is passed to an error detector 31 of conventional design to produce a control signal for a driver 33 ultimately to change the frequency of the first local oscillator 15 as required to track a target.

It will now be evident that use of the described embodiment of the invention allows all of the objects of this invention to be met. In particular, it should be observed that troublesome characteristics of a voltage-controlled oscillator, i.e. the tendency of such an oscillator to drift with time or change in ambient temperature and nonlinearities normally encountered are completely obviated even though the voltage-controlled oscillator used may be constructed in the simplest possible manner without any provision for stabilization. It should also be observed that, in contrast to the output of any known frequency synthesizers, the output of the described arrangement, with proper design considerations, is spectrally pure so filtering is not necessarily required.

Having described a preferred embodiment of this invention, it will now be apparent to one of skill in the art that modifications may be made without departing from the inventive concepts. Thus, the crystal oscillator 23F need not be an element separate and distinct from the illustrated receiver. That is to say, if (as would almost always be true) reference oscillators are provided for purposes not discussed herein, the outputs of such oscillators, alone or mixed, may be used in lieu of the output of the crystal oscillator. It is felt, therefore, that the invention should not be restricted to its disclosed embodiment, but rather should be limited only by the spirit and scope of the appended claims.

I claim:

1. In an inverse receiver using a first local oscillator whose frequency is to be automatically controlled to track a Doppler-shifted echo signal, the control signal for such purpose being derived from the output signal of a voltage-controlled oscillator tunable through a frequency spectrum encompassing the range of possible Doppler shift frequencies of echo signals to be received, circuitry for initiating and maintaining operation of the voltage-controlled oscillator, such circuitry comprising:
   (a) means for initially setting the frequency of the voltage-controlled oscillator at a frequency higher than the highest possible Doppler shift frequencies and then decreasing the frequency of the voltage-controlled oscillator to sweep through the range of possible Doppler shift frequencies; and
   (b) means for then sensing when the frequency of the voltage-controlled oscillator equals the Doppler shift frequency of the Doppler-shifted echo signal and thereafter controlling the frequency of the voltage-controlled oscillator to track such Doppler shift frequency.

* * * * *